US005912476A

United States Patent [19]

Watanabe et al.

[11] Patent Number: 5,912,476

[45] Date of Patent: *Jun. 15, 1999

[54] COMPOUND SEMICONDUCTOR EPITAXIAL WAFER

[75] Inventors: Masataka Watanabe; Tsuneyuki Kaise; Masayuki Shinohara; Masahisa Endou, all of Gunma-ken, Japan

[73] Assignee: Shin-Etsu Handotai Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/770,500

[22] Filed: Dec. 20, 1996

[30] Foreign Application Priority Data

Dec. 27, 1995 [JP] Japan .................................... 7-352990

[51] Int. Cl.$^6$ .................................................... H01L 33/00

[52] U.S. Cl. ............................ 257/94; 257/101; 438/45; 438/46

[58] Field of Search ............................... 257/86, 87, 101, 257/201, 615, 94

[56] References Cited

U.S. PATENT DOCUMENTS

| | | | |
|---|---|---|---|
| 3,725,249 | 4/1973 | Groves et al. | 148/175 |
| 4,252,576 | 2/1981 | Hasegawa et al. | 148/33.4 |
| 4,354,140 | 10/1982 | Nishizawa | 313/499 |

FOREIGN PATENT DOCUMENTS

| | | |
|---|---|---|
| 43 25 331 | 2/1994 | Germany . |
| 57-001239 | 4/1982 | Japan . |
| 60-214524 | 3/1986 | Japan . |
| 60-216537 | 3/1986 | Japan . |
| 6-196756 | 7/1994 | Japan . |
| 7-0666454 | 7/1995 | Japan . |

*Primary Examiner*—Olik Chaudhuri
*Assistant Examiner*—Douglas A. Wille
*Attorney, Agent, or Firm*—Ronald R. Snider; Snider & Chao, LLP

[57] ABSTRACT

A compound semiconductor epitaxial wafer added with nitrogen to provide a high luminous efficiency. Epitaxial layers are grown on a single crystalline substrate 4 made of gallium phosphide or gallium arsenide to form a compound semiconductor epitaxial wafer EW. The epitaxial layers include at least an nitrogen-added gallium phosphide arsenide mixed crystalline epitaxial layer having an n-type carrier concentration descending gradually toward the uppermost surface of the grown layer in a continuous or stepwise manner before p-type impurity is diffused, and contain an intermediate layer 83 with an n-type carrier concentration of $4\times10^{14}/cm^3$ or more and less than $3.5\times10^{15}/cm^3$, and a surface layer 84 having an n-type carrier concentration equals to or lower than that for the intermediate layer 83.

13 Claims, 4 Drawing Sheets

COMPOUND SEMICONDUCTOR EPITAXIAL WAFER

The present disclosure relates to subject matter contained in Japanese patent application No. 352990 (filed on Dec. 27, 1995) which is expressly incorporated herein by reference in its entirety.

BACKGROUND OF THE INVENTION

1. Field of the Invention

The present invention relates to a compound semiconductor epitaxial wafer, in particular to a compound semiconductor epitaxial wafer having a gallium phosphide arsenide mixed-crystalline epitaxial layer added with nitrogen.

2. Description of the Related Art

Conventional indirect transition III-V compound light-emitting diodes producing most popularly red light but also yielding orange or yellow lights, in particular those based on gallium phosphide arsenide $GaAs_{1-x}P_x$ (where, $0.45 \leqq x < 1.0$) employ an epitaxial wafer in which a $GaAs_{1-x}P_x$ epitaxial layer is grown on a gallium phosphide GaP or gallium arsenide GaAs single-crystalline substrate, and an uppermost area of the epitaxial layer is doped through diffusion of p-type impurity to form a p-n junction, operating as a light emitting region.

Light emission occurs when an electron and a hole injected upon external voltage application recombine within a light emitting region, that is, a p-n junction area. n-Type carrier concentration is referred as one major factor affecting the luminous efficiency, which has conventionally been set at $1\times10^{15}/cm^3$ or above.

Japanese Examined Patent Publication No. 1539 in 1983, for example, describes n-type carrier concentration being limited within a range of $3.5\times10^{15}/cm^3$ to $8.8\times10^{15}/cm^3$ both inclusive.

In another Japanese Examined Patent Publication No. 101589 in 1994, a specific composition is proposed in which carrier concentration in the n-type epitaxial layer be fallen within $1\times10^{15}$ to $50\times10^{15}/cm^3$, and a ratio of transition peak intensity observed in photocurrent spectra in relation to nitrogen concentration be controlled to fall within a range which is limited with an emission peak energy.

The reason why n-type carrier concentration has been set to $1\times10^{15}/cm^3$ or above is that lowering carrier concentration of n-type epitaxial layer is difficult, and that most attempt to lower the concentration beyond that level would often result in an extremely low carrier concentration.

To obtain a maximum emission output, it is necessary to choose, before p-type impurity diffusion, an n-type carrier concentration to an appropriate range for an area or around where a p-n junction (referred as a p-n junction formation area, hereinafter) is formed by a diffusion of a p-type impurity from the uppermost surface of the n-type epitaxial layer.

Since a high concentration of n-type carrier in the vicinity of the p-n junction formation area, for example, causes an unstable luminance level due to low crystal quality and a lowered luminance due to increased absorption of the light, it is preferable to maintain the n-type carrier concentration to a lower level. When the n-type carrier concentration becomes extremely low, on the contrary, opportunities of recombination of electrons and holes become fewer and causes a lowered emission output and a higher forward voltage Vf.

In short, it is essential to set an n-type carrier concentration in an appropriate range, since both of the too high or too low concentrations in the vicinity of the p-n junction formation area can ruin the emission output.

Nitrogen concentration is referred as another factor known to govern the luminous efficiency. Since a light emitting diode using indirect III-V semiconductor results in inefficient emission with a p-n junction alone, general applicaion adds nitrogen acting as an emission center called as an isoelectronic trap in the emission region to improve the efficiency. It is thus said that the concentration of nitrogen added as an isoelectronic trap, as well as n-type carrier concentration, are critical factors affecting luminance, wavelength and other emission characteristics.

Conventional luminous efficiency has, however, been restricted to a lower level since available lower limit of n-type carrier concentration was so limitative that difficulties have been met in optimizing its combination with nitrogen concentration.

SUMMARY OF THE INVENTION

It is therefore an object of the present invention to provide a compound semiconductor epitaxial wafer with an improved emission output, in which nitrogen-added gallium phosphide arsenide $GaAs_{1-x}P_x$ epitaxial water is optimized in its n-type carrier concentration distribution, or in the combination of n-type carrier concentration and concentration of nitrogen, that is an isoelectronic trap.

The inventors of the present invention, having devotedly been investigating into the distribution of n-type carrier concentration in the direction of the thickness of nitrogen-added gallium phosphide arsenide mixed crystalline epitaxial layer, and into optimizating combination of n-type carrier and nitrogen concentrations, which have reached compound semiconductor epitaxial wafer composed as mentioned below.

In accordance with an aspect of the present invention, the above object is attained by providing a compound semiconductor epitaxial wafer having a single crystalline substrate made of gallium phosphide or gallium arsenide and epitaxial layers grown on its surface, in which the epitaxial layers have at least a nitrogen-added gallium phosphide arsenide mixed crystalline epitaxial layer, whose n-type carrier concentration before being diffused with p-type impurity is descending toward the uppermost surface of the grown layer in a continuous or stepwise manner.

In the invention, the gallium phosphide arsenide mixed crystalline epitaxial layers have in the vicinity of p-n junction formation area an intermediate layer with a n-type carrier concentration ranging from $4\times10^{14}/cm^3$ to $3.5\times10^{15}/cm^3$, the lower end inclusive, and a surface layer having a n-type carrier concentration equals to or lower than that of the intermediate layer. A more preferable range for n-type carrier is from $4\times10^{14}/cm^3$ to $1.0\times10^{15}/cm^3$, the lower end inclusive, for the intermediate layer, and more lower for the surface layer.

Thickness of the intermediate layer preferably ranges from 7 to 15 $\mu$m, both inclusive. A preferable range of thickness of the surface layer is from 2 to 5 $\mu$m.

The gallium phosphide arsenide mixed crystalline epitaxial layer is preferably added with nitrogen at a concentration so that $\Delta\alpha$ falls within 100 to 300/cm both inclusive, where $\Delta\alpha$ is difference of absorption coefficient $\alpha$ for gallium phosphide arsenide mixed crystalline epitaxial layer without nitrogen addition and absorption coefficient $\alpha_N$ for nitrogen-added gallium phosphide arsenide mixed crystalline epitaxial layer ($\Delta\alpha=\alpha_N-\alpha$) measured with a light at a wavelength equals to or equivalent to an absorption wavelength $\lambda_N$ of exciton bound by nitrogen added as an isoelectronic trap. More preferable range of $\Delta\alpha$ is 150 to 250/cm both inclusive.

As for a compound semiconductor epitaxial wafer of the present invention, it is preferable to reduce carrier concentration in the nitrogen-added gallium phosphide arsenide mixed crystalline epitaxial layer toward the uppermost surface of the grown layer in a continuous or stepwise manner, which results in improved crystallinity in the vicinity of the p-n junction formation area, improved emission characteristics due to reduced loss ascribable to light absorption, and prevention of increasing trends in forward voltage Vf.

The emission characteristics can further be improved by optimizing a combination of n-type carrier concentration and that for nitrogen acts as an isoelectronic trap.

BRIEF DESCRIPTION OF THE DRAWINGS

The above and other objects, features and advantages of the present invention will become apparent from the following detailed description when taken with the accompanying drawings in which.

DESCRIPTION OF THE PREFERRED EMBODIMENTS

The present invention will be detailed in connection with several preferred embodiments.

Figure 1:
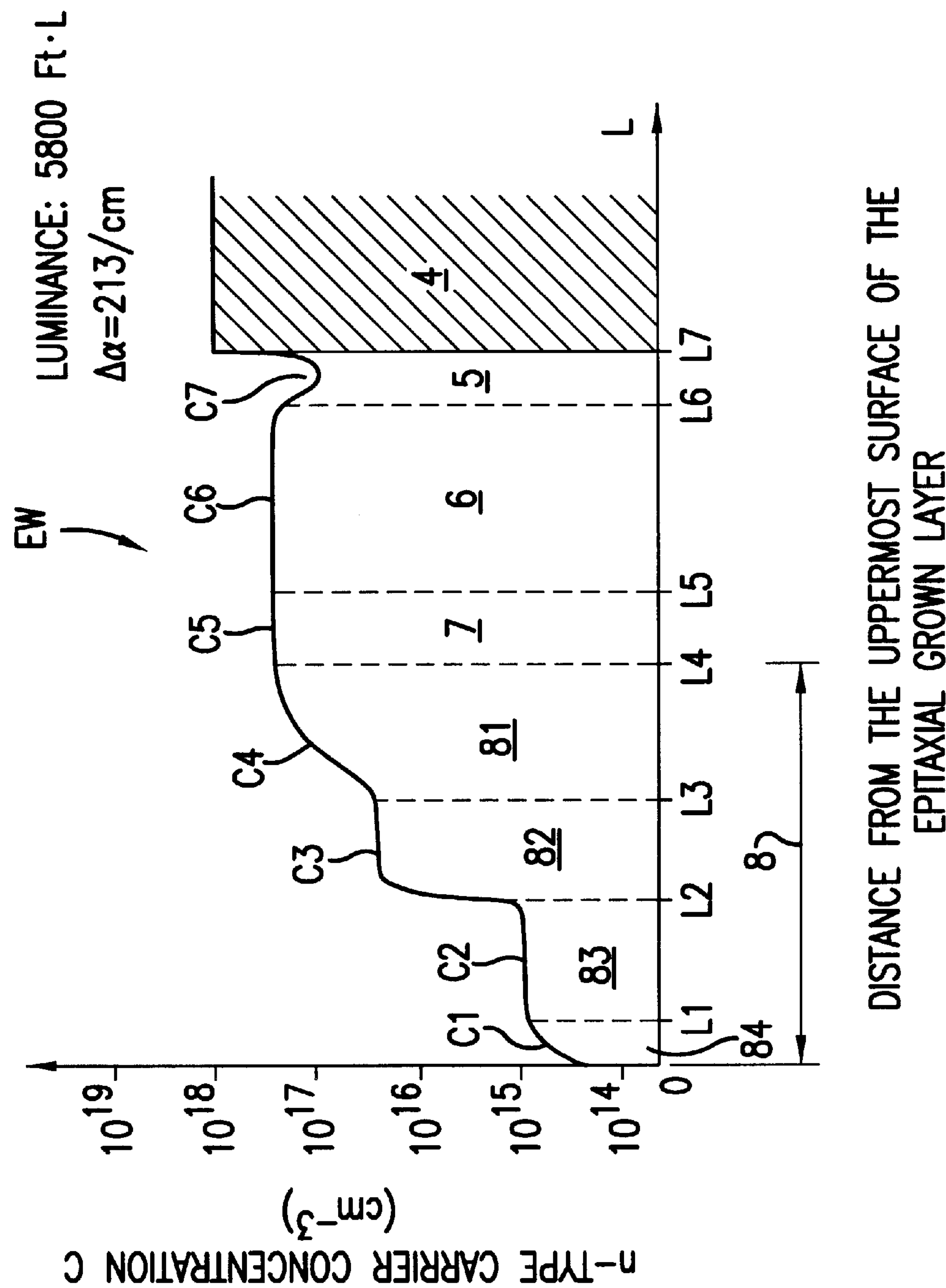
FIG. 1 shows a graphical representation of distribution of n-type carrier concentration along with the direction of the film thickness as plotted against the distance from the uppermost surface of the grown layer on a compound semiconductor epitaxial wafer in accordance with a first embodiment of the invention.

FIG. 1 shows a graphical representation of the distribution of n-type carrier concentration along with the direction of the film thickness as plotted against the distance from the uppermost surface of the epitaxially grown layer on a compound semiconductor epitaxial wafer in accordance with a first embodiment of the invention.

Figure 2:
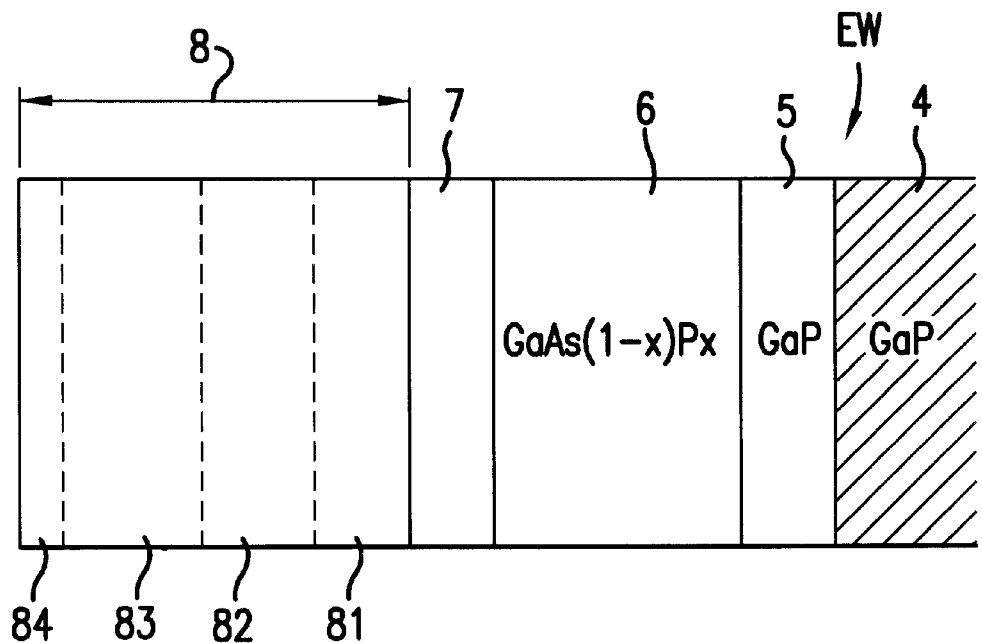
FIG. 2 shows a schematic sectional view for explaining the structure of the compound semiconductor epitaxial wafer shown in FIG. 1.

FIG. 2 shows a schematic sectional view for explaining a constitution of the compound semiconductor epitaxial wafer shown in FIG. 1.

As illustrated in FIG. 2, a compound semiconductor epitaxial wafer EW of the invention comprises a gallium phosphide single crystal substrate 4, a gallium phosphide epitaxial layer 5 being grown on the substrate 4, a gallium phosphide arsenide $GaAs_{1-x}P_x$ crystal mixing ratio gradient layer 6 with its crystal mixing ratio gradually varied in the direction of the layer growth, being grown on the epitaxial layer 5, a gallium phosphide arsenide $GaAs_{1-a}P_a$ composition-constant layer 7, with its crystal mixing ratio "a" kept constant being layered on the crystal mixing ratio gradient layer 6, and a gallium phosphide arsenide $GaAs_{1-a}P_a$ epitaxial layer 8 added with nitrogen being formed on the composition-constant layer 7.

The nitrogen-added epitaxial layer 8 further comprises in this order a nitrogen concentration adjusting layer 81 for gradually adjusting the concentration of nitrogen to be added being formed adjacent to the composition-constant layer 7, a steady layer 82 having a constant nitrogen concentration, a intermediate layer 83 which provides a p-n junction area and occupies its n-type area, and a surface layer 84 where p-type impurity to be diffused.

A light emitting diode is finished after diffusing p-type impurity from the uppermost area of the surface layer 84 into the hetero-structured epitaxial wafer EW mentioned above, bonding electrodes, dicing to an appropriate size, and enclosing into a package.

The above description for the case that gallium phosphide GaP used as a single crystal substrate will also apply to the case that gallium arsenide GaAs is used instead.

Next, a constitution of a compound semiconductor epitaxial wafer of the invention will be described referring to the depth profile of the n-type carrier concentration against the distance from the uppermost surface of the epitaxial layer as shown in FIG. 1.

This figure depicts one example of the depth profile of n-type carrier concentration for a gallium phosphide arsenide $GaAs_{1-x}P_x$ epitaxial wafer EW (x=0.89 for the nitrogen-added epitaxial layer 8) with its concention of nitrogen as an isoelectronic trap predetermined to attain a difference of absorption coefficient $\Delta\alpha$ of 213/cm, and having a luminance of 5800 Ft·L, in which the abscissa and ordinate denote distance L from the uppermost surface of the epitaxial grown layer and n-type carrier concentration C ($/cm^3$), respectively.

Distance L7-L6 from the uppermost surface of the epitaxial grown layer corresponds to the gallium phosphide GaP layer 5 with a thickness of 4 $\mu$m, within which carrier concentration c7 is so given that starting from $5\times10^{17}/cm^3$, which equals to an n-type carrier concentration of the single crystal substrate 4, decreasing to $1\times10^{17}/cm^3$, and then being partially recovered to $3\times10^{17}/cm^3$.

Similarly, distances L6-L5 and L5-L4 correspond to the gallium phosphide arsenide $GaAs_{1-x}P_x$ crystal mixing ratio gradient layer 6 and gallium phosphide arsenide $GaAs_{1-a}P_a$ composition constant layer 7, respectively. In these layers with thicknesses of 5 $\mu$m and 4.5 $\mu$m, respectively, carrier concentrations c6, c5 are almost constant at $3\times10^{17}/cm^3$ for both of them.

An area between distance L4 and the uppermost surface of the epitaxial layer corresponds to the nitrogen-added epitaxial layer 8. The nitrogen concentration adjusting layer 81 occupying the lowest part of the layer 8 is formed between distances L4 and L3 into 4-$\mu$m thick with a carrier concentration c4 descended from $3\times10^{17}/cm^3$ to $3\times10^{16}/cm^3$ toward the uppermost surface of the grown layer.

The steady layer 82 of 4 $\mu$m-thick corresponded to the area between distances L3 and L2 has a carrier concentration c3 almost constant at $3\times10^{16}/cm^3$ as continued from the lower end of carrier concentration c4, the intermediate layer 83 of 8 $\mu$m-thick corresponded to the area between distances L2 and L1 has a carrier concentration c2 as maintained almost as plateau after a sharp drop from carrier concentration c3 to $8\times10^{14}/cm^3$, and the surface layer 84 of 4 $\mu$m-thick corresponded to the area between distance L1 and the uppermost surface has a carrier concentration c1 as gradually decreased from carrier concentration c2 to $5\times10^{14}/cm^3$ along the direction of the layer growth.

In the epitaxial growth layers of the compound semiconductor epitaxial wafer EW of the invention, it is thus mentioned that n-type carrier concentration gradually decreases in continuous and step-wise manners over the range from the nitrogen concentration adjusting layer 81 to the surface layer 84.

n-Type carrier concentration is preferably selected in a range of $1\times10^{16}$ to $50\times10^{16}/cm^3$ for the area between the gallium phosphide GaP epitaxial layer 5 and the steady layer 82, in a range of $4\times10^{14}$ to $35\times10^{14}/cm^3$ for the intermediate layer 83, and at a concentration not higher than that of the intermediate layer 83 for the surface layer 84, for all the ranges both marginal values inclusive.

Figure 6:
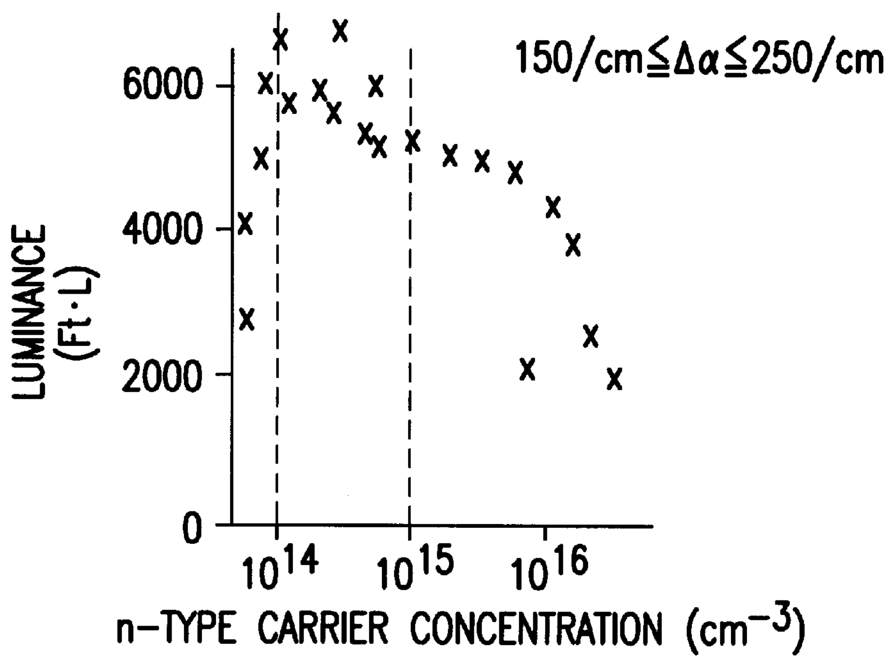
FIG. 6 shows a graphical representation of luminance of a compound semiconductor epitaxial wafer of the invention as plotted against n-type carrier concentration.

FIG. 6 shows a diagram of relations between n-type carrier concentration and emission luminance for the nitrogen-added intermediate layer 83 to which nitrogen is added to adjust $\Delta\alpha$ within a range from 150 to 250/cm both inclusive.

As is known from this figure, an n-type carrier concentration equals to or exceeding $3.5\times10^{15}/cm^3$ degrades the crystal uniformity to make the luminance level unstable, and the degraded crystal quality and associated increase in absorptivity of light will cause emission luminance to be lowered.

An n-type carrier concentration of $4\times10^{14}/cm^3$ or below, on the contrary, will lead to reduction in the number of electron, which will lessen opportunities for electron-hole recombination to cause lowered emission output and higher forward voltage Vf.

As is also seen from FIG. 6, a most eminent luminance is obtained when the n-type carrier concentration of the intermediate layer 83 equals to or higher than $4\times10^{14}/cm^3$ and lower than $1\times10^{15}/cm^3$.

It is more preferable to choose a layer thickness between 18 and 30 $\mu$m for the nitrogen added epitaxial layer 8, within which the steady layer 82 is favorably set to 1 $\mu$m or above, the intermediate layer 83 set to 7 to 15 $\mu$m and the surface layer 84 set to 2 to 5 $\mu$m, with all marginal values inclusive.

Figure 3:
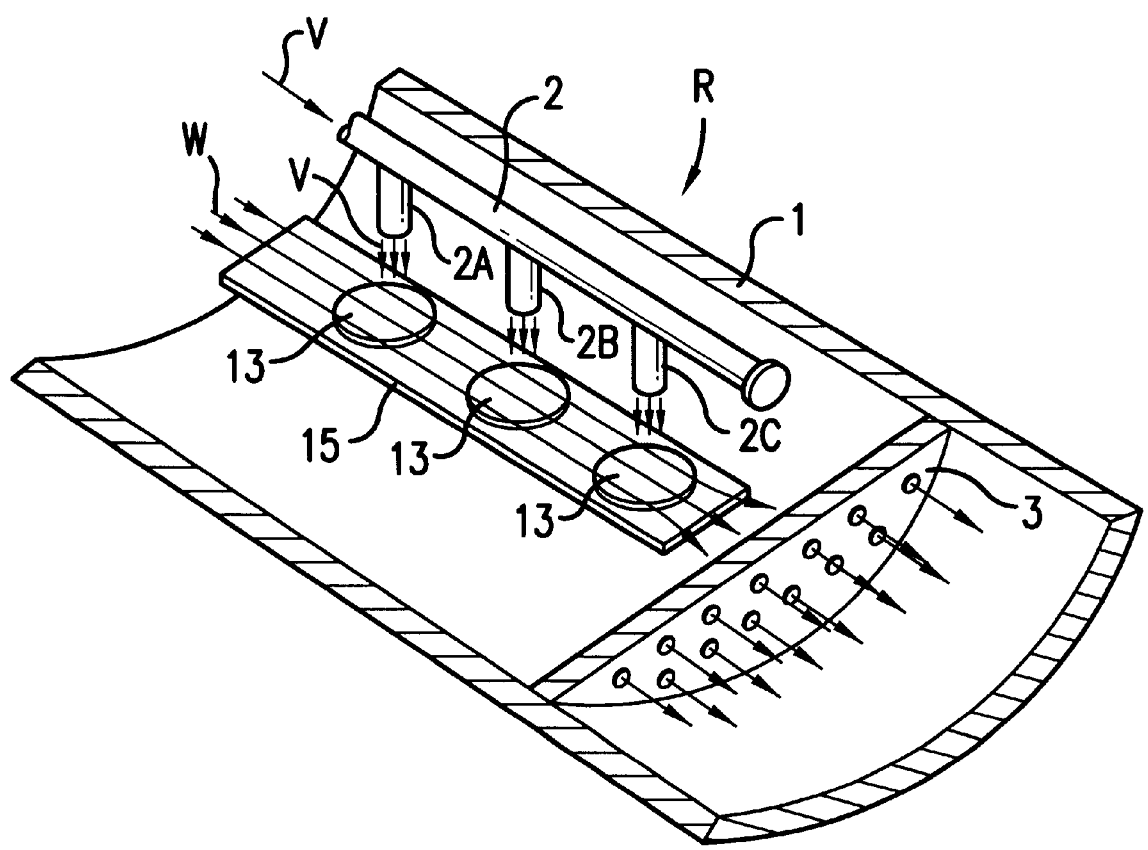
FIG. 3 shows a perspective view, partly broken, of an essential portion of an epitaxial wafer manufacturing equipment applicable to the process of a compound semiconductor epitaxial wafer of the invention.

FIG. 3 shows a perspective view of a production apparatus R of a compound semiconductor epitaxial wafer of the invention.

This apparatus R comprises a lengthy boat 15 with its lefthand side being directed to upstream and the righthand side to downstream in this figure, and a gas feeding pipe 2 extended over the boat 15, equipped on which are gas discharge nozzles 2A, 2B and 2C aligned in this order from the upstream to the downstream. Through these nozzles 2A, 2B and 2C, group V source gas V such as arsine or phosphine is supplied into the production apparatus R. A vessel of the production apparatus containing the boat 15 and the gas feeding pipe 2 are not shown in this figure.

On the boat 15, a plurality of substrate is loaded from the upperstream to downstream and exposed to the group V souce gas V discharged downward from the gas discharge nozzles 2A, 2B and 2C. On the other hand, the group III source gas W mainly composed of gallium is separately supplied from the upstream of the boat 15 toward the downstream.

Unlike the conventional appratus allowing the group III and the group V source gases to flow concomitantly from the upper or lower ends of the reaction tube to the opposite ends, the epitaxial wafer production appratus R described above allows the group V source gas to flow alone and be delivered close to each substrate 13 through the pipe and dispersively supplied, thus enabling the n-type carrier concentration to be controlled to $1\times10^{15}/cm^3$ or below, such a low level hardly being controlled by the conventional appararus.

That is, the conventional constitution based on batch supply of source gases has been suffering from erosion of quartz-made reaction tube 1 at around the portion close to the inlet of the source gases where exposure of the reaction tube 1 to high concentration source gases would occur. Silicon released from the reaction tube as the result will be incorporated into the wafer together with dopants supplied into the reaction tube 1 to operate as an n-type carrier. It is thus contemplated that the past failure in controlling the carrier concentration at $1\times10^{15}/cm^3$ or below is ascribable to fluctuation in the amount of silicon, released due to erosion of the reaction tube 1, from $7\times10^{14}$ to $30\times10^{14}/cm^3$.

In the above epitaxial wafer production appratus R, each gas discharge nozzle dispersively supplies the group V source gas v at a concentration only one-third to one-fourth of that in the conventional appratus, resulted in the source gas not being concentrated at a portion, so that the quartz-made reaction tube can almost exempt from erosion and thus hardly supply silicon, a possible n-type carrier. n-Type carrier concentration thus enabled to be controlled at $1\times10^{15}/cm^3$ or below.

Still another important merit of the above epitaxial wafer production apparatus R relates to precise control of flow rate, that is supply volume, of, in particular, the group V source gas V, which enables control for epitaxial film thickness, and precise control for carrier concentration and crystal mixing ratio in each layer. The above epitaxial wafer production apparatus R further employs a shielding plate 3 in the downstream of the boat 15 to prevent inverse diffusion of impurities from the exhaust portion of the reaction tube 1. Thus this appratus is conveniently used for producing a compound semiconductor epitaxial wafer of the invention.

The paragraphs below describe a method for producing a compound semiconductor epitaxial wafer of the invention using the aforementioned production appratus R.

First, the group III source gas W and the group V source gas V are flowed separately toward single crystal substrates 4 with supply volume of the group V gas being precisely controlled in particular, to grow the gallium phosphide GaP epitaxial layer 5, the gallium phosphide arsenide $GaAs_{1-x}P_x$ crystal mixing ratio gradient layer 6 with its crystal mixing ratio being varied gradually in the direction of the layer growth, and the gallium phosphide arsenide $GaAs_{1-a}P_a$ composition-constant layer 7 with constant crystal mixing ratio "a".

On the composition-constant layer 7, a nitrogen concentration adjusting layer 81, a steady layer 82, an intermediate layer 83 and a surface layer 84 were grown adjacent to each other in this order to compose a nitrogen-added epitaxial layer 8, during which n-type dopant gas was supplied in a continuously or stepwisely reducing manner over the growth period from the steady layer 82 to the intermediate layer 83, and the n-type dopant gas was stopped for the growth period of the surface layer 84.

Figure 4:
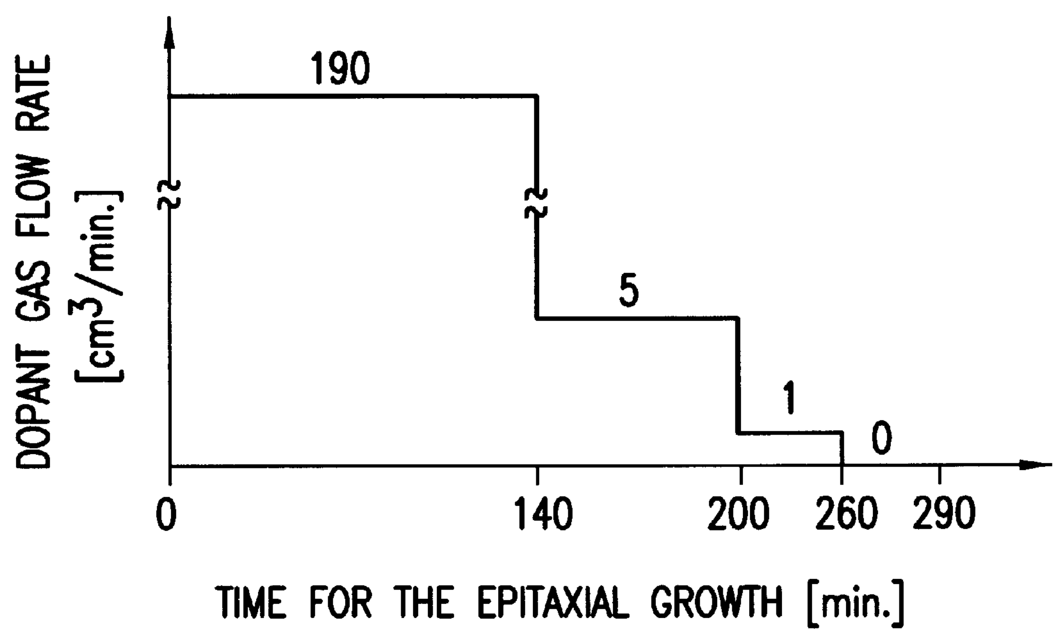
FIG. 4 shows a graphical representation of changes in flow rate of a dopant gas as plotted against time for the epitaxial growth.

FIG. 4 shows an example of changes in flow rate for supplying dopant gas according to the growth period of the epitaxial layer. Hydrogen sulfide $H_2S$ as an n-type dopant gas was diluted to 50 ppm with hydrogen gas $H_2$ then supplied at 190 $cm^3$/min for 140 min during a period from starting the growth of the epitaxial layer to completion of the formation of the composition constant layer 7, at 7 $cm^3$/min for 60 min during the formation of the nitrogen concentration adjusting layer 81 and the steady layer 82, at 1 $cm^3$/min for 60 min during the formation of the intermediate layer 83, whereas the gas supply was discontinued for 30 min during the formation of the surface layer 84.

Thus an n-type carrier concentration in the nitrogen-added epitaxial layer 8 is provided so that it descends continuously and stepwisely toward the uppermost surface of the surface layer 84. This leads to improved crystallinity in the vicinity of the p-n junction formation area and, as a consequence, improved emisson characteristics. Forward voltage Vf was also prevented from being increased since n-type carrier concentration toward the substrate side is gradually increased to prevent n-type carrier concentration from becoming too low.

In a compound semiconductor epitaxial wafer of this invention, nitrogen concentration as optimally combined with the n-type carrier concentration as mentioned above can be determined according to the $\Delta\alpha$ method based on differences in absorption coefficient.

The $\Delta\alpha$ method is referred as a method for measuring the concentration of nitrogen added as an isoelectronic trap in indirect transition compound semiconductor (Japanese Patent Application No. 55509 in 1995), in which light having a wavelength equals to or almost equals to an absorption wavelength $\lambda_N$ ascribable to an exciton bound to an isoelectronic trap is employed as an incident light, an absorption coefficient $\alpha_N$ of the nitrogen-added compound semiconductor for the incident light is subtracted by an absorption coefficient $\alpha$ of the nitrogen-free compound semiconductor to give difference $\Delta\alpha$, then the nitrogen concentration is determined from known correlation between $\Delta\alpha$ and nitrogen concentration in compound semiconductor.

Denoting $I_O$ for an intensity of incident light, $I_N$ and I for intensities of transmitted light, $\alpha_N$ for an absorption coefficient of nitrogen-added GaP, and $\alpha$ for an absorption coefficient of nitrogen-free GaP, then $\Delta\alpha$ which represents difference between $\alpha_N$ and $\alpha$ is obtained by measuring transmitted light intensities $I_N$ and I.

Thus the concentration of nitrogen added as an isoelectronic trap in the nitrogen-added epitaxial layer 8 is obtained in a nondestructive, accurate and facilitated manner by making reference to a previously obtained correlation of light absorption coefficient with $\alpha$ and $\alpha_N$. It has also been confirmed that there is an excellent correlation between $\Delta\alpha$ and nitrogen concentration determiened by SIMS.

Figure 5:
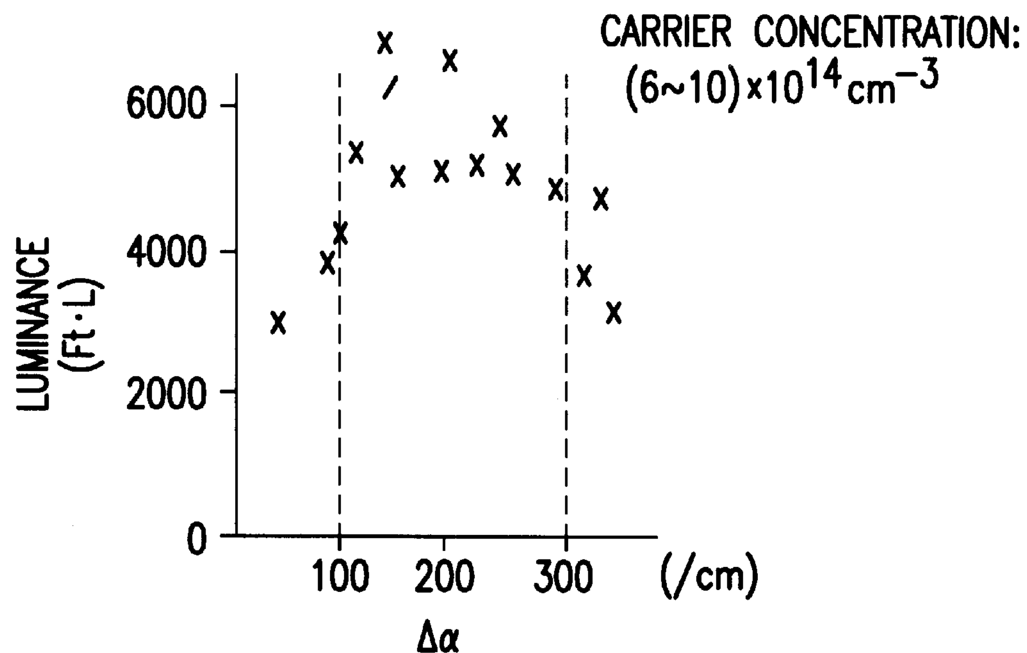
FIG. 5 shows a graphical representation of luminance of a compound semiconductor epitaxial wafer of the invention as plotted against $\Delta\alpha$.

FIG. 5 shows a relationship between luminance and $\Delta\alpha$ for a compound semiconductor epitaxial wafer thus prepared by the invention having a carrier concentration of $6\times10^{14}$ to $10\times10^{14}/cm^3$.

When $\Delta\alpha$ is defined as representing difference between an absorption coefficient $\alpha$ of nitrogen-free compound semiconductor and an absorption coefficient $\alpha_N$ of nitrogen-added indirect transition III-V compound semiconductor, favorable luminance is attainable for $\Delta\alpha$ ranging from 100 to 300/cm (both ends inclusive) as known from FIG. 5. The best performance is obtained for $\Delta\alpha$ ranging more preferably from 150 to 250/cm (both ends inclusive).

It is also made clear from FIGS. 5 and 6 that a best emission luminance can be accomplished by properly selecting the carrier concentration in the p-n junction forming area and nitrogen concentration expressed by $\Delta\alpha$.

As will be clear from the foregoing explanation, in accordance with the present invention, a compound semiconductor epitaxial wafer is constructed so that the combination of carrier concentration in the p-n junction forming area and corresponding nitrogen concentration is optimized, which allows full utilization of its emission properties and exerts a special merit in achieving high emission luminance.

Since the n-type carrier concentration in the nitrogen-added epitaxial layer is set properly low and gradually descending toward the uppermost surface of the surface layer, crystal uniformity is improved to stabilize luminance level, and to save the loss caused by light reabsorption. Further merits include stabilized processes and improved yield ratio.

While the present invention has been described in connection certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A compound semiconductor epitaxial wafer comprising a single crystalline substrate made of gallium phosphide or gallium arsenide and epitaxial layers grown on said substrate, wherein said epitaxial layers include gallium phosphide arsenide mixed crystalline epitaxial layers of nitrogen-added as an isoelectronic trap, and said nitrogen-added gallium phosphide arsenide mixed crystalline epitaxial layers have an n-type carrier concentration descending gradually toward the uppermost surface of the grown layer in a stepwise manner before p-type impurity is diffused.

2. A wafer as set forth in claim 1, wherein said nitrogen-added gallium phosphide arsenide mixed crystalline epitaxial layers include in the vicinity of the p-n junction formation area an intermediate layer having an n-type carrier concentration of $4\times10^{14}/cm^3$ or more and less than $3.5\times10^{15}/cm^3$, and a surface layer having an n-type carrier concentration equal to or lower than that for said intermediate layer.

3. A wafer as set forth in claim 2, wherein said nitrogen-added gallium phosphide arsenide mixed crystalline epitaxial layers include said intermediate layer having an n-type carrier concentration of $4\times10^{14}/cm^3$ or more and less than $1.0\times10^{15}/cm^3$.

4. A wafer as set forth in claim 2 wherein said nitrogen-added gallium phosphide arsenide mixed crystalline epitaxial layers include said intermediate layer of 7 to 15 $\mu$m thick and said surface layer of 2 to 5 $\mu$m thick.

5. A wafer as set forth in claim 1, wherein said nitrogen-added gallium phosphide arsenide mixed crystalline epitaxial layer is added with nitrogen at a concentration allowing $\Delta\alpha$ to fall within 100 to 300/cm both inclusive, where $\Delta\alpha$ represents difference between an absorption coefficient $\alpha$ of a nitrogen-free gallium phosphide arsenide mixed crystalline epitaxial layer and an absorption coefficient $\alpha_N$ of a nitrogen-added gallium phosphide arsenide mixed crystalline epitaxial layer ($\Delta\alpha=\alpha_N$) measured by using an incident light at a wavelength equal to or almost equal to an absorption wavelength $\lambda_N$ ascribable to exciton bound to nitrogen added as an isoelectronic trap.

6. A wafer as set forth in claim 5, wherein $\Delta\alpha$ ranges from 150 to 250/cm both inclusive.

7. A compound semiconductor epitaxial wafer comprising a single crystalline substrate made of gallium phosphide or gallium arsenide and epitaxial layers grown on said substrate, wherein said epitaxial layers include gallium phosphide arsenide mixed crystalline epitaxial layers of nitrogen-added as an isoelectronic trap, having an n-type carrier concentration descending gradually toward the uppermost surface of the grown layer in a stepwise manner before p-type impurity is diffused, and said nitrogen-added gallium phosphide arsenide mixed crystalline epitaxial layers include in the vicinity of the p-n junction formation area an intermediate layer having an n-type carrier concentration of $4\times10^{14}/cm^3$ or more and less than $3.5\times10^{15}/cm^3$, and a surface layer having an n-type carrier concentration equal to or lower than that for said intermediate layer.

8. A wafer as set forth in claim 7, wherein said nitrogen-added gallium phosphide arsenide mixed crystalline epitaxial layers include said intermediate layer having an n-type carrier concentration of $4\times10^{14}/cm^3$ or more and less than $1.0\times10^{15}/cm^3$.

9. A wafer as set forth in claim 7 wherein said nitrogen-added gallium phosphide arsenide mixed crystalline epitaxial layers include said intermediate layer of 7 to 15 $\mu$m thick and said surface layer of 2 to 5 $\mu$m thick.

10. A wafer as set forth in claim 7 wherein said nitrogen-added gallium phosphide arsenide mixed crystalline epitaxial layer is added with nitrogen at a concentration allowing $\Delta\alpha$ to fall within 100 to 300/cm both inclusive, where $\Delta\alpha$ represents difference between an absorption coefficient $\alpha$ of a nitrogen-free gallium phosphide arsenide mixed crystalline epitaxial layer and an absorption coefficient $\alpha_N$ of a nitrogen-added gallium phosphide arsenide mixed crystalline epitaxial layer ($\Delta\alpha=\alpha_N$) measured by using an incident light at a wavelength equal to or almost equal to an absorption wavelength $\lambda_N$ ascribable to exciton bound to nitrogen added as an isoelectronic trap.

11. A wafer as set forth in claim 10, wherein $\Delta\alpha$ ranges from 150 to 250/cm both inclusive.

12. A wafer as set forth in claim 1, wherein the gallium phosphide arsenide mixed crystalline epitaxial layers-added as an isoelectronic trap are located in an active layer of said wafer.

13. A wafer as set forth in claim 7, wherein the gallium phosphide arsenide mixed crystalline epitaxial layers-added as an isoelectronic trap are located in an active layer of said wafer.

* * * * *